(12) United States Patent
Song et al.

(10) Patent No.: US 12,016,199 B2
(45) Date of Patent: Jun. 18, 2024

(54) DISPLAY DEVICE

(71) Applicant: SAMSUNG DISPLAY CO., LTD., Yongin-si (KR)

(72) Inventors: Hyun Gue Song, Hwaseong-si (KR); Hee Seong Jeong, Suwon-si (KR); Sun Hwa Kim, Hwaseong-si (KR); Hyun Ho Jung, Hwaseong-si (KR); Sang Min Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/333,515

(22) Filed: Jun. 12, 2023

(65) Prior Publication Data
US 2023/0354638 A1    Nov. 2, 2023

Related U.S. Application Data

(63) Continuation of application No. 17/087,520, filed on Nov. 2, 2020, now Pat. No. 11,678,511.

(30) Foreign Application Priority Data

Mar. 30, 2020    (KR) ........................ 10-2020-0038235

(51) Int. Cl.
*H10K 50/844*    (2023.01)
*H10K 50/858*    (2023.01)
(Continued)

(52) U.S. Cl.
CPC ....... *H10K 50/8445* (2023.02); *H10K 50/858* (2023.02); *H10K 59/124* (2023.02); *H10K 2102/351* (2023.02)

(58) Field of Classification Search
CPC ....... H01L 33/54; H01L 33/486; H01L 33/56; H10K 50/8445; H10K 50/858;
(Continued)

(56) References Cited

U.S. PATENT DOCUMENTS

2018/0108869 A1    4/2018 Maeda
2018/0123068 A1    5/2018 Ushikubo et al.
(Continued)

FOREIGN PATENT DOCUMENTS

KR          10-1573752 B1    12/2015
KR    10-2016-0036722 A     4/2016
(Continued)

*Primary Examiner* — Kevin Quarterman
(74) *Attorney, Agent, or Firm* — Lewis Roca Rothgerber Christie LLP

(57) ABSTRACT

A display device includes: a substrate; a display element on the substrate; a capping layer on the display element; an optical layer on the capping layer, and including: a first optical layer on the display element; and a second optical layer on the first optical layer; and a thin film encapsulation layer on the optical layer, and including: a first inorganic encapsulation layer on the second optical layer; an auxiliary layer on the first inorganic encapsulation layer; an organic encapsulation layer on the auxiliary layer; and a second inorganic encapsulation layer on the organic encapsulation layer. A refractive index of the second optical layer is smaller than a refractive index of the capping layer, and a refractive index of the first optical layer is between the refractive index of the second optical layer and the refractive index of the capping layer.

16 Claims, 12 Drawing Sheets

(51) Int. Cl.
*H10K 59/124* (2023.01)
*H10K 102/00* (2023.01)

(58) Field of Classification Search
CPC ........... H10K 59/124; H10K 2102/351; H10K 50/844; H10K 59/12
See application file for complete search history.

(56) References Cited

U.S. PATENT DOCUMENTS

| | | |
|---|---|---|
| 2018/0294440 A1 | 10/2018 | Ushikubo |
| 2019/0197924 A1 | 6/2019 | Jeon |
| 2019/0198810 A1 | 6/2019 | Song et al. |
| 2020/0258946 A1 | 8/2020 | Kim et al. |

FOREIGN PATENT DOCUMENTS

| | | |
|---|---|---|
| KR | 10-2019-0015682 A | 2/2019 |
| KR | 10-2019-0076615 A | 7/2019 |
| KR | 10-2020-0136552 A | 12/2020 |

DISPLAY DEVICE

CROSS-REFERENCE TO RELATED APPLICATIONS

This application is a continuation of U.S. patent application Ser. No. 17/087,520, filed Nov. 2, 2020, which claims priority to and the benefit of Korean Patent Application No. 10-2020-0038235, filed Mar. 30, 2020, the entire content of both of which is incorporated herein by reference.

BACKGROUND

1. Field

Aspects of embodiments of the present disclosure relate to a display device.

2. Description of the Related Art

In recent years, the purposes of use for display devices have been diversified. In addition, because the thickness and weight of the display device are being reduced, the range of use of the display device is increasing, and thus, research on display devices that may be used in various fields is continuously being conducted.

Display elements provided in the display device emit light of a predetermined color to provide an image, and the emitted light may pass through a sealing member for sealing the display elements. In the case where the sealing member has a structure in which a plurality of layers are stacked, the light emitted from the display element may undergo interference due to the film thickness of the sealing member.

The above information disclosed in this Background section is for enhancement of understanding of the background of the present disclosure, and therefore, it may contain information that does not constitute prior art.

SUMMARY

One or more example embodiments of the present disclosure are directed to a display device capable of reducing a color shift (e.g., a specific or predetermined color shift) at an angle (e.g., a specific or predetermined angle) by arranging an optical layer between a display element and a sealing member.

However, aspects and features of the present disclosure are not limited to the above, and the above and other aspects and features of the present disclosure will become more apparent to one of ordinary skill in the art to which the present disclosure pertains by referencing the detailed description of the present disclosure given below, and/or by practicing one or more embodiments of the present disclosure.

According to one or more example embodiments of the present disclosure, a display device includes: a substrate; a display element on the substrate; a capping layer on the display element; an optical layer on the capping layer, and including: a first optical layer on the display element; and a second optical layer on the first optical layer; and a thin film encapsulation layer on the optical layer, and including: a first inorganic encapsulation layer on the second optical layer; an auxiliary layer on the first inorganic encapsulation layer; an organic encapsulation layer on the auxiliary layer; and a second inorganic encapsulation layer on the organic encapsulation layer. A refractive index of the second optical layer is smaller than a refractive index of the capping layer, and a refractive index of the first optical layer is between the refractive index of the second optical layer and the refractive index of the capping layer.

In an example embodiment, the refractive index of the first optical layer may be in a range from 1.62 to 1.89, and a thickness of the first optical layer may be in a range from 20 nm to 60 nm.

In an example embodiment, the refractive index of the second optical layer may be in a range from 1.45 to 1.62, and a thickness of the second optical layer may be in a range from 40 nm to 100 nm.

In an example embodiment, the refractive index of the capping layer may be in a range from 1.6 to 2.3, and a thickness of the capping layer may be in a range from 30 nm to 120 nm.

In an example embodiment, a thickness of the auxiliary layer may be in a range from 30 nm to 100 nm, and a thickness of the first inorganic encapsulation layer may be in a range from 400 nm to 2200 nm.

In an example embodiment, the auxiliary layer may be interposed between the first inorganic encapsulation layer and the organic encapsulation layer, a refractive index of the first inorganic encapsulation layer may be greater than a refractive index of the auxiliary layer, and the refractive index of the auxiliary layer may be between the refractive index of the first inorganic encapsulation layer and a refractive index of the organic encapsulation layer.

In an example embodiment, the refractive index of the auxiliary layer may satisfy: $\min(n1, n2)+|n2-n1|\times 0.25 < n3 < \min(n1, n2)+|n2-n1|\times 0.75$, where n3 may represent the refractive index of the auxiliary layer, n1 may represent the refractive index of the first inorganic encapsulation layer, n2 may represent the refractive index of the organic encapsulation layer, $\min(n1, n2)$ may represent a minimum value of n1 and n2, and $|n2-n1|$ may represent an absolute value of a difference between n2 and n1.

In an example embodiment, each of the first inorganic encapsulation layer and the auxiliary layer may include an inorganic insulating material.

In an example embodiment, the display device may further include: a lower layer interposed between the auxiliary layer and the organic encapsulation layer.

In an example embodiment, a refractive index of the auxiliary layer may be greater than a refractive index of the organic encapsulation layer, and a refractive index of the lower layer may be between the refractive index of the auxiliary layer and the refractive index of the organic encapsulation layer.

In an example embodiment, the refractive index of the auxiliary layer may satisfy: $\min(n1, n2)+|n2-n1|\times 0.25 < n3 < \min(n1, n2)+|n2-n1|\times 0.75$, where n3 may represent the refractive index of the auxiliary layer, n1 may represent a refractive index of the first inorganic encapsulation layer, n2 may represent the refractive index of the lower layer, $\min(n1, n2)$ may represent a minimum value of n1 and n2, and $|n2-n1|$ may represent an absolute value of a difference between n2 and n1.

In an example embodiment, the refractive index of the lower layer may be 0.05 less than the refractive index of the organic encapsulation layer, and the lower layer may include an inorganic insulating material.

In an example embodiment, the lower layer and the auxiliary layer may include an inorganic insulating material including a silicon element, a nitrogen element, and an oxygen element, and an oxygen content of the lower layer may be greater than an oxygen content of the auxiliary layer.

In an example embodiment, the first inorganic encapsulation layer may include a plurality of stacked films.

According to one or more example embodiments of the present disclosure, a display device includes: a substrate; organic light emitting diodes on the substrate; a capping layer on the organic light emitting diodes; an optical layer on the capping layer, and including: a first optical layer on the organic light emitting diodes; and a second optical layer on the first optical layer; and a thin film encapsulation layer on the optical layer to encapsulate the organic light emitting diodes, and including: a first inorganic encapsulation layer on the second optical layer; an auxiliary layer on the first inorganic encapsulation layer; an organic encapsulation layer on the auxiliary layer; and a second inorganic encapsulation layer on the organic encapsulation layer. A refractive index of the second optical layer is smaller than a refractive index of the capping layer, and a refractive index of the first optical layer is between the refractive index of the second optical layer and the refractive index of the capping layer.

In an example embodiment, the refractive index of the first optical layer may be in a range from 1.62 to 1.89, a thickness of the first optical layer may be in a range from 20 nm to 60 nm, the refractive index of the second optical layer may be in a range from 1.45 to 1.62, and a thickness of the second optical layer may be in a range from 40 nm to 100 nm.

In an example embodiment, the refractive index of the capping layer may be in a range from 1.6 to 2.3, and a thickness of the capping layer may be in a range from 30 nm to 120 nm.

In an example embodiment, a thickness of the auxiliary layer may be in a range from 30 nm to 100 nm, and a thickness of the first inorganic encapsulation layer may be in a range from 400 nm to 2200 nm.

In an example embodiment, the auxiliary layer may be interposed between the first inorganic encapsulation layer and the organic encapsulation layer, a refractive index of the first inorganic encapsulation layer may be greater than a refractive index of the auxiliary layer, the refractive index of the auxiliary layer may be between the refractive index of the first inorganic encapsulation layer and a refractive index of the organic encapsulation layer, and the refractive index of the auxiliary layer may satisfy: $\min(n1, n2)+|n2-n1|\times 0.25 < n3 < \min(n1, n2)+|n2-n1|\times 0.75$, where n3 may represent the refractive index of the auxiliary layer, n1 may represent the refractive index of the first inorganic encapsulation layer, n2 may represent the refractive index of the organic encapsulation layer, $\min(n1, n2)$ may represent a minimum value of n1 and n2, and $|n2-n1|$ may represent an absolute value of a difference between n2 and n1.

In an example embodiment, each of the first inorganic encapsulation layer and the auxiliary layer may include an inorganic insulating material.

The display device according to one or more example embodiments of the present disclosure may reduce a color shift (e.g., a specific or predetermined color shift) at an angle (e.g., a specific or predetermined angle) by disposing the optical layer between the display element and the sealing member.

However, the aspects and features of the present disclosure are not limited to the aforementioned aspects and features, and various other aspects and features are included in the present specification.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
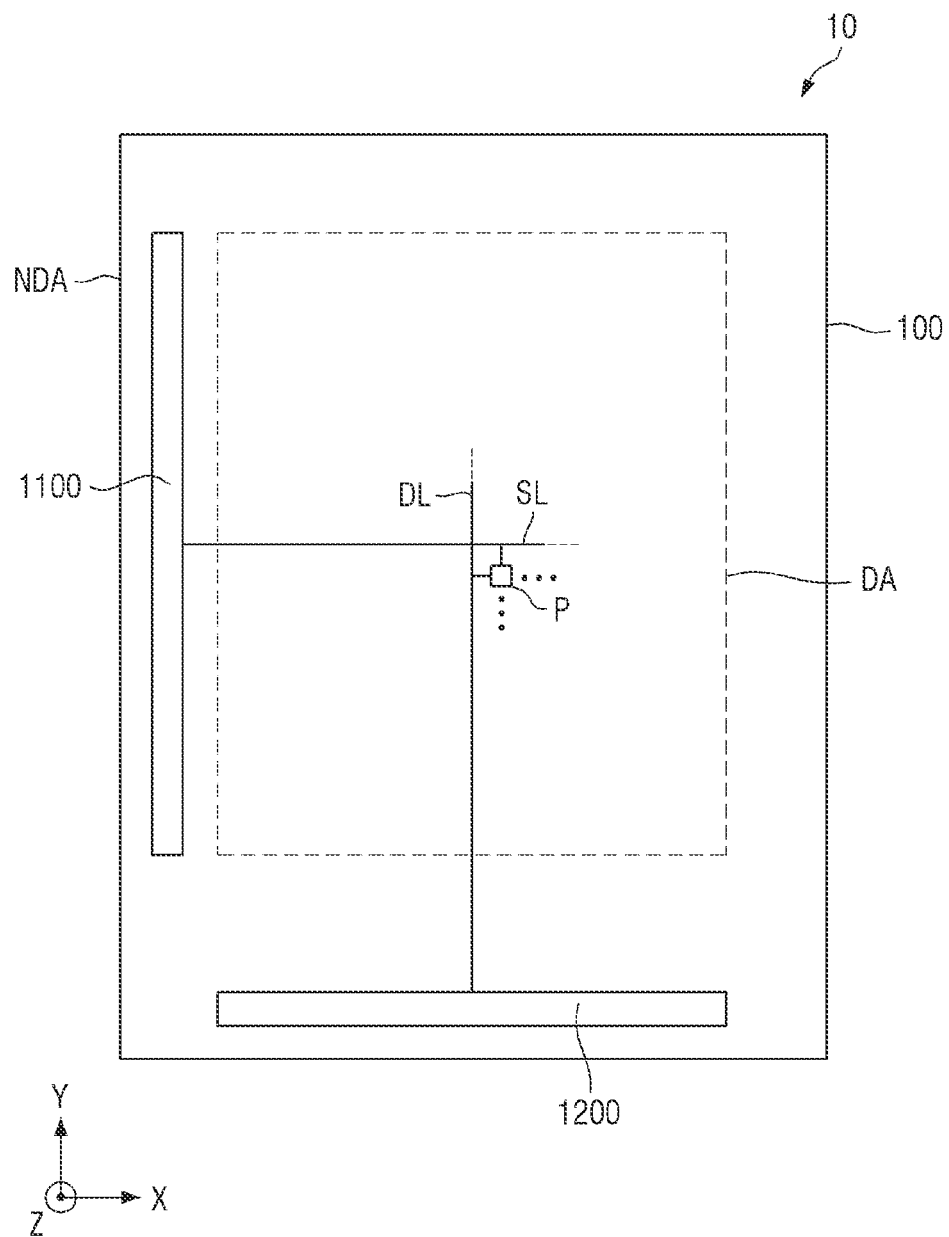
FIG. 1 is a plan view schematically showing a display device according to an example embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when an embodiment may be implemented differently, a specific process order may be performed differently from the described order. For example, two consecutively described processes may be performed at the same or substantially at the same time or performed in an order opposite to the described order. Unless otherwise noted, like reference numerals denote like elements throughout the attached drawings and the written description, and thus, redundant descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Further, in the figures, the x-axis, y-axis, and z-axis are not limited to three axes on the Cartesian coordinate system, and may be interpreted in a broad sense including the same. For example, the x-axis, y-axis, and z-axis may be orthogonal to each other, but may also refer to different directions that are not orthogonal to each other.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when elements, layers, films, regions, or components are referred to as being "electrically connected" to each other, the elements, the layers, the films, the regions, or the components may be directly electrically connected to each other, or may be indirectly electrically connected to each other with one or more intervening elements, layers, films, regions, or components being present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" may include A, B, or A and B. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view schematically showing a display device according to an example embodiment.

Referring to FIG. 1, a display device 10 may include a display area DA, and a non-display area NDA adjacent to the display area DA. For example, in some embodiments, the non-display area NDA may surround (e.g., around a periphery of) the display area, or may be adjacent to at least one end of the display area DA. The display device 10 includes a plurality of pixel regions P disposed at (e.g., in or on) the display area DA. A display element capable of emitting light of a desired color (e.g., a predetermined color) may be disposed in each pixel region P, and the display element may be connected to a scan line SL and a data line DL. FIG. 1 may be understood as a state of a substrate 100 of the display device 10. For example, it may be understood that the substrate 100 includes the display area DA and the non-display area NDA.

At (e.g., in or on) the non-display area NDA, a scan driver 1100 that provides a scan signal to each pixel region P through the scan line SL (e.g., though a corresponding scan line SL), a data driver 1200 that provides a data signal to a display element provided in each pixel region P through the data line DL (e.g., through a corresponding data line DL), and main power wiring for providing first and second power supply voltages may be disposed.

FIG. 1 illustrates that the data driver 1200 is disposed on the substrate 100, but in another embodiment, the data driver 1200 may be disposed on a flexible printed circuit board (FPCB) that is electrically connected to a pad disposed on one side of the display device 10.

The display device 10 according to an embodiment of the present disclosure may include an organic light emitting display, an inorganic light emitting display, a quantum dot display, or the like. Hereinafter, for convenience, an organic light emitting display may be described as the display device according to an embodiment of the present disclosure, but the present disclosure is not limited thereto, and the aspects and features of one or more example embodiments of the present disclosure described in more detail below may be applied to various suitable kinds of display devices, such as at least the different kinds of display devices described above.

Figure 2:
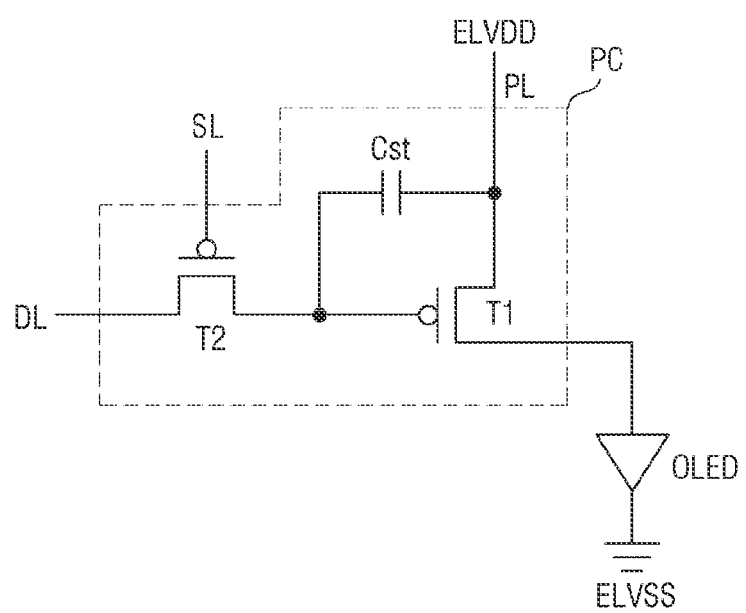
FIG. 2 illustrates a display element disposed in one pixel region of a display device and a pixel circuit connected thereto according to an example embodiment.

FIG. 2 illustrates a display element disposed in one pixel region of a display device and a pixel circuit connected thereto according to an example embodiment.

Referring to FIG. 2, an organic light emitting diode OLED, which is a display element, is connected to a pixel circuit PC. The pixel circuit PC may include a first thin film transistor T1, a second thin film transistor T2, and a storage capacitor Cst. The organic light emitting diode OLED may emit, for example, red, green, or blue light, or as another example, may emit red, green, blue, or white light.

The second thin film transistor T2 is a switching thin film transistor, and is connected to the scan line SL and the data line DL. The second thin film transistor T2 may transfer a data voltage (e.g., the data signal), which is input from the data line DL, to the first thin film transistor T1 according to a switching voltage (e.g., the scan signal) input from the scan line SL. The storage capacitor Cst may be connected to (e.g., may be connected between) the second thin film transistor T2 and a driving voltage line PL. The storage capacitor Cst may store a voltage corresponding to a difference between a voltage received from the second thin film transistor T2 and a first power supply voltage ELVDD supplied to the driving voltage line PL.

The first thin film transistor T1 may be, as a driving thin film transistor, connected to the driving voltage line PL and the storage capacitor Cst, and may control a driving current flowing through the organic light emitting diode OLED from the driving voltage line PL in response to the voltage (e.g., a voltage value) stored in the storage capacitor Cst. The organic light emitting diode OLED may emit light having a desired luminance (e.g., a predetermined luminance) according to the driving current. A counter electrode (e.g., a cathode) of the organic light emitting diode OLED may be supplied with a second power supply voltage ELVSS.

FIG. 2 illustrates that the pixel circuit PC includes two thin film transistors and one storage capacitor, but the present disclosure is not limited thereto, and in other embodiments, the number of thin film transistors and/or the number of storage capacitors may be variously modified depending on a structure or a design of the pixel circuit PC.

Figure 3:
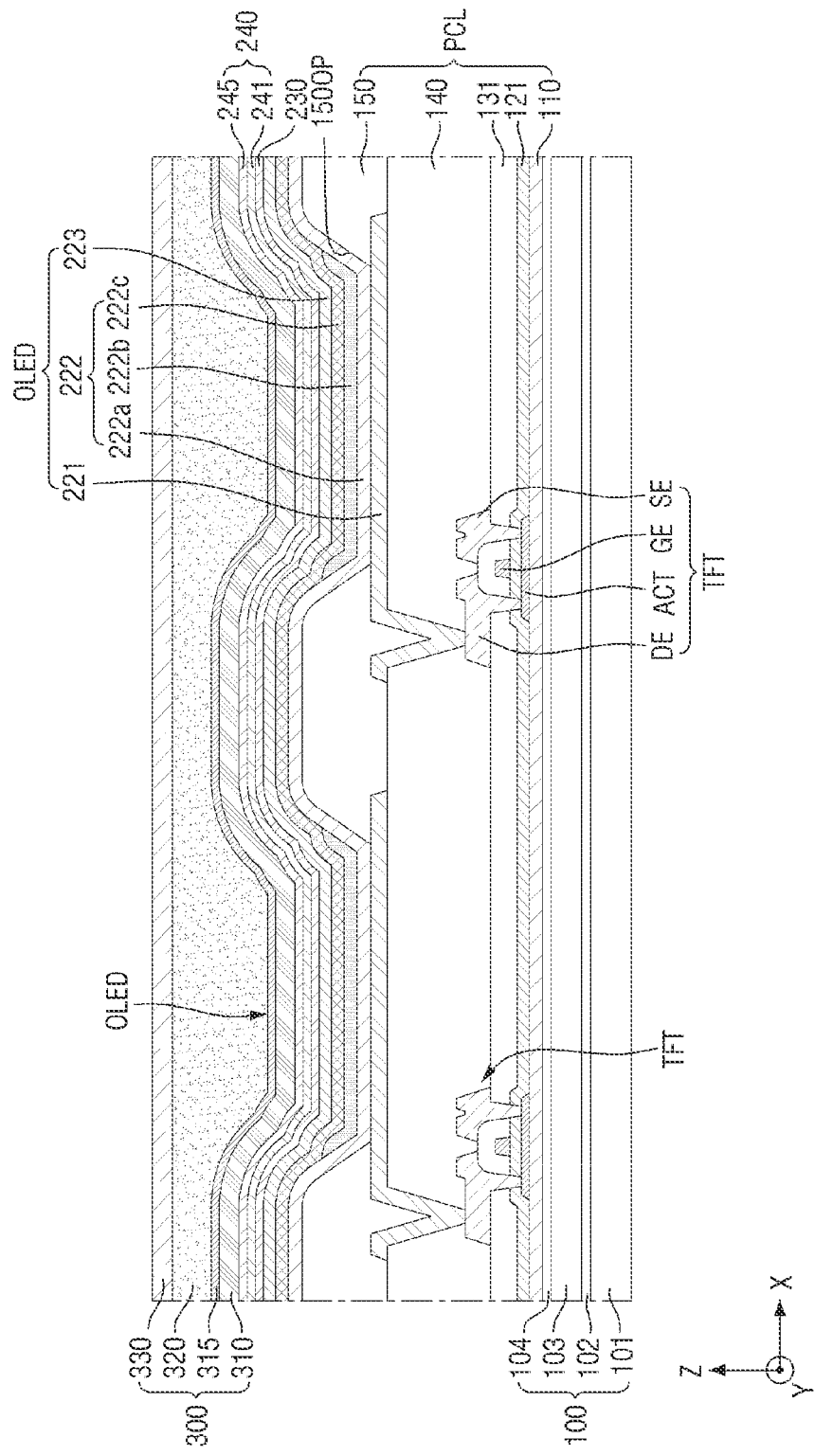
FIG. 3 is a cross-sectional view illustrating a portion of a display device according to an example embodiment.

FIG. 3 is a cross-sectional view illustrating a portion of a display device according to an example embodiment.

Referring to FIG. 3, a pixel circuit layer PCL including a pixel circuit is disposed on the substrate 100. The organic light emitting diode OLED, which may be a display element, is disposed on the pixel circuit layer PCL, and the organic light emitting diode OLED may be covered by a thin film encapsulation layer 300.

The substrate 100 may include a polymer resin. The substrate 100 including the polymer resin may have flexible, rollable, and/or bendable characteristics.

In an embodiment, the substrate 100 may include a first base layer 101, a first barrier layer 102, a second base layer 103, and a second barrier layer 104 as shown in FIG. 3. Each of the first base layer 101 and the second base layer 103 may include a polymer resin. For example, the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and/or cellulose acetate propionate (CAP). The first barrier layer 102 and the second barrier layer 104 may be barrier layers that prevent or substantially prevent the penetration of foreign substances, and may each be a single layer structure or a multilayered structure including one or more inorganic materials, for example, such as silicon nitride and/or silicon oxide.

Figure 4:
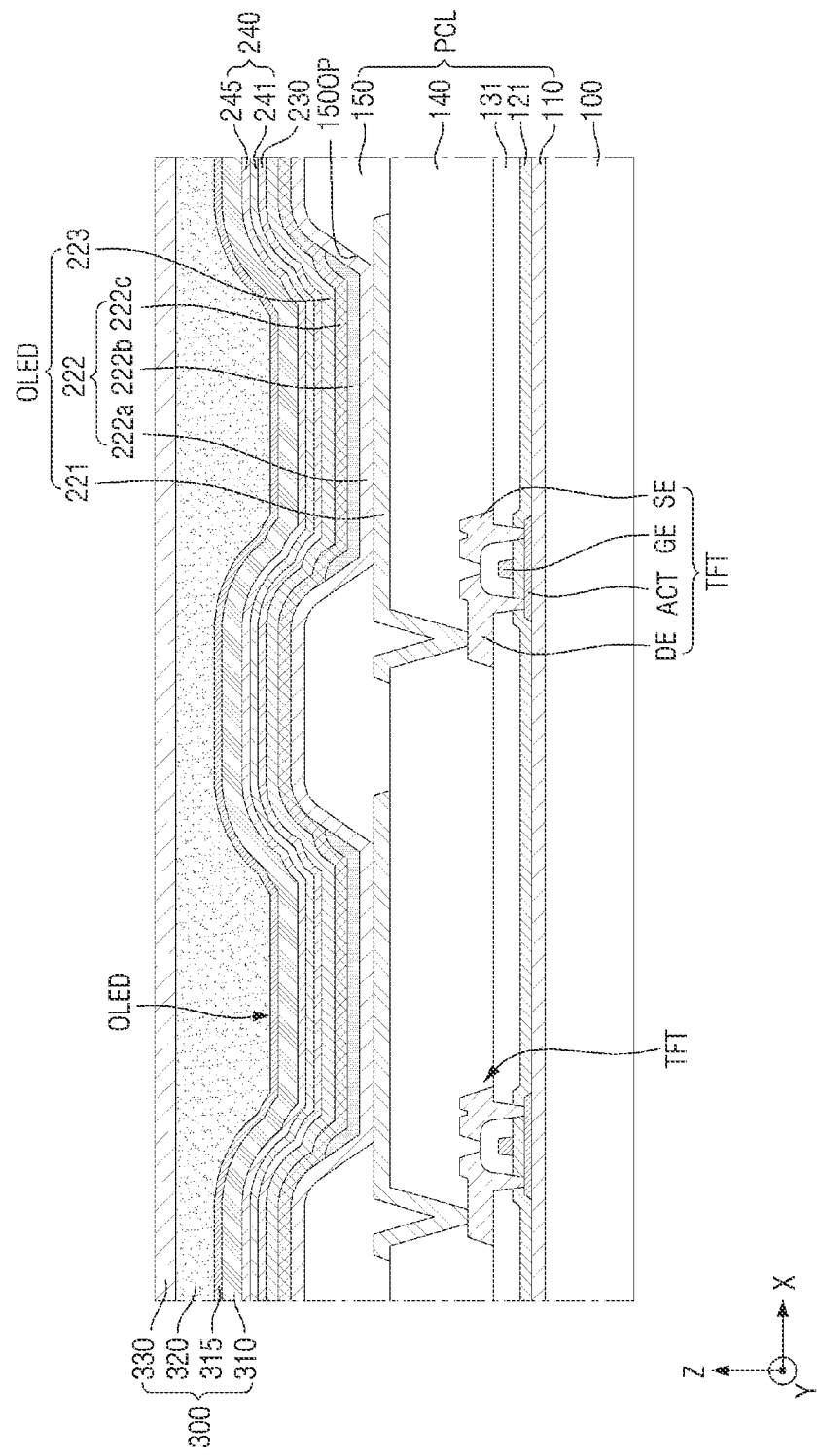
FIG. 4 is a cross-sectional view illustrating a portion of a display device according to a modified example of the display device of FIG. 3.

FIG. 4 is a cross-sectional view illustrating a portion of a display device according to a modified example of the display device of FIG. 3.

As a modified example, the substrate 100 may be a single layer structure including a glass material as illustrated in FIG. 4, instead of the multilayered structure as illustrated in FIG. 3. For example, the substrate 100 may be a glass substrate with SiO2 as a main component.

Referring to FIGS. 3 and 4, in some embodiments, the pixel circuit layer PCL on the substrate 100 of FIGS. 3 and 4 may include a thin film transistor TFT, and a storage capacitor (e.g., Cst in FIG. 2) connected to the thin film transistor TFT. The structure of the thin film transistor TFT may have the same or substantially the same structure for each pixel. The thin film transistor TFT of each pixel may be connected to a display element provided in each pixel.

The thin film transistor TFT may include a semiconductor layer ACT, a gate electrode GE, a source electrode SE, and a drain electrode DE. The semiconductor layer ACT may include amorphous silicon, polycrystalline silicon, or an organic semiconductor material. In order to secure the insulating property between the semiconductor layer ACT and the gate electrode GE, a gate insulating layer 121 including an inorganic material, for example, such as silicon oxide, silicon nitride, and/or silicon oxynitride, may be interposed between the semiconductor layer ACT and the gate electrode GE. An interlayer insulating layer 131 including an inorganic material, for example, such as silicon oxide, silicon nitride, and/or silicon oxynitride, may be disposed on the gate electrode GE, and the source electrode SE and the drain electrode DE may be disposed on the interlayer insulating layer 131. The insulating layer (e.g., the gate insulating layer 121, the interlayer insulating layer 131, and/or the like) containing the inorganic material may be formed through chemical vapor deposition (CVD) or atomic layer deposition (ALD).

The gate electrode GE, the source electrode SE, and the drain electrode DE may be formed of various suitable conductive materials. The gate electrode GE may include, for example, molybdenum or aluminum, and may have a single layer structure or a multilayered structure. For example, the gate electrode GE may be a single layer of molybdenum, or may have a three-layered structure including a molybdenum layer, an aluminum layer, and a molybdenum layer. The source electrode SE and the drain electrode DE may include titanium or aluminum, and may have a single layer structure or a multilayered structure. In an embodiment, the source electrode SE and the drain electrode DE may have a three-layered structure including a titanium layer, an aluminum layer, and a titanium layer.

A buffer layer 110 including an inorganic material, for example, such as silicon oxide, silicon nitride, and/or silicon oxynitride, may be interposed between the thin film transistor TFT and the substrate 100 (e.g., having the above-described structure of FIG. 3 or FIG. 4). The buffer layer 110 may serve to enhance the smoothness of the upper surface of the substrate 100, and/or to prevent or to substantially prevent (e.g., to minimize) impurities from penetrating from the substrate 100 or the like into the semiconductor layer ACT of the thin film transistor TFT.

A planarization insulating layer 140 may be disposed on the thin film transistor TFT. The planarization insulating layer 140 may be formed of an organic material, for example, such as acryl, benzocyclobutene (BCB), or hexamethyldisiloxane (HMDSO). In FIGS. 3 and 4, the planarization insulating layer 140 is illustrated as a single layer structure, but may be a multilayered structure.

The organic light emitting diode OLED includes a pixel electrode 221, an intermediate layer 222, and a counter electrode 223.

The pixel electrode 221 is disposed on the planarization insulating layer 140, and may be disposed one for each pixel. The pixel electrode 221 may be a reflective electrode. In an embodiment, the pixel electrode 221 may include a reflective film containing, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 may include a transparent or translucent electrode layer disposed above and/or below the reflective film described above. The above-described transparent or translucent electrode layer may include, for example, at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 221 may have a three-layered structure of an ITO layer, an Ag layer, and an ITO layer.

A pixel defining film 150 is disposed on the pixel electrodes 221. The pixel defining film 150 has an opening 150OP exposing the central portion of each pixel electrode 221. The pixel defining film 150 may increase the distance between the edge of the pixel electrode 221 and the counter electrode 223, thereby preventing or substantially preventing an arc or the like from occurring at the edge of the pixel electrode 221. The pixel defining film 150 may include an organic insulating material, for example, such as polyimide, polyamide, acrylic resin, benzocyclobutene, hexamethyld-isiloxane (HMDSO), and/or phenol resin, and may be formed by a method such as spin coating.

In some embodiments, the intermediate layer 222 may include a first functional layer 222a, a light emitting layer 222b, and a second functional layer 222c. The light emitting layer 222b may be disposed on the pixel electrode 221 exposed through the opening 150OP of the pixel defining film 150. The light emitting layer 222b may include an organic material including, for example, a fluorescent or phosphorescent material capable of emitting red, green, or red light. The organic material of the light emitting layer 222b may be a low molecular organic material or a high molecular organic material.

The first functional layer 222a and the second functional layer 222c may be disposed below and above the light emitting layer 222b, respectively. The first functional layer 222a may include, for example, a hole transport layer (HTL), or a hole transport layer and a hole injection layer (HIL). The second functional layer 222c may be an element disposed on the light emitting layer 222b, and may include, for example, an electron transport layer (ETL) and/or an electron injection layer (EIL). However, the present disclosure is not limited thereto, and the second functional layer 222c may be optional. For example, in some embodiments, the second functional layer 222c may not be provided (e.g., may be omitted).

While the light emitting layers 222b are respectively disposed to correspond to the openings 150OP of the pixel defining film 150, the first functional layer 222a and the second functional layer 222c may be a common layer that are integrally formed to cover the substrate 100 as a whole (e.g., to cover an entirety of at least the display area DA), similar to the counter electrode 223 described in more detail below, for example, to cover the entire display area DA of the substrate 100.

In some embodiments, the counter electrode 223 may include a (semi) transparent layer containing, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), an alloy thereof, or the like. In another embodiment, the counter electrode 223 may further include a layer such as ITO, IZO, ZnO, or $In_2O_3$ on the (semi) transparent layer containing the one or more of the aforementioned materials. In an embodiment, the counter electrode 223 may include silver (Ag), magnesium (Mg), or an alloy of silver (Ag) and magnesium (Mg).

A capping layer 230 may be disposed on the counter electrode 223. For example, the capping layer 230 may include LiF, an inorganic insulating material, or an organic insulating material. The capping layer 230 may cover and protect the counter electrode 223 from the top (e.g., a top surface) of the counter electrode 223.

An optical layer 240 may be disposed on the capping layer 230. The optical layer 240 may include two or more stacked layers. For example, the optical layer 240 may include a first optical layer 241, and a second optical layer 245 disposed on the first optical layer 241. The first optical layer 241 may be disposed on the capping layer 230. The first optical layer 241 may be interposed between the capping layer 230 and the second optical layer 245. The term 'interposed' as used herein refers to a corresponding component that is in direct contact with upper and lower components between which the corresponding component is interposed. In other words, the first optical layer 241 may directly contact the capping layer 230 and the second optical layer 245.

The optical layer 240 may include an inorganic insulating material. For example, the optical layer 240 may include one or more inorganic insulating materials selected from the group consisting of aluminum oxide, titanium oxide, tantalum oxide, hafnium oxide, zinc oxide, silicon oxide, silicon nitride, and silicon oxynitride. The materials of the first optical layer 241 and the second optical layer 245 may be different from each other, or may be the same as each other.

As described above, the display elements provided in the display device emit light of a desired color (e.g., a predetermined color) to provide an image, and the emitted light may pass through the thin film encapsulation layer 300 (which will be described in more detail below) for sealing the display elements. When the thin film encapsulation layer 300 has a structure in which a plurality of layers are stacked, as in an embodiment described in more detail below, light emitted from the display element may undergo interference due to the film thickness of the thin film encapsulation layer 300. Due to the generated interference, a user may observe the screen of the display device to be greenish (e.g., to turn greenish) at a large viewing angle (e.g., 60° or more). However, according to the display device of one or more example embodiments of the present disclosure, as described in more detail below, by adjusting the refractive index and the thickness of the optical layer 240, a phenomenon in which the user may observe the screen of the display device to be greenish at a large viewing angle (e.g., 60° or more) due to the generated interference may be prevented or substantially prevented.

The thin film encapsulation layer 300 may be disposed on the optical layer 240. The thin film encapsulation layer 300 may include at least one inorganic encapsulation layer and at least one organic encapsulation layer. For example, as illustrated in FIGS. 3 and 4, the thin film encapsulation layer 300 may include a first inorganic encapsulation layer 310 on the second optical layer 245, an organic encapsulation layer 320 on the first inorganic encapsulation layer 310, and a second inorganic encapsulation layer 330 on the organic encapsulation layer 320. The thin film encapsulation layer 300 may include an auxiliary layer 315 interposed between the first inorganic encapsulation layer 310 and the organic encapsulation layer 320.

In some embodiments, the first inorganic encapsulation layer 310 and the second inorganic encapsulation layer 330 may include one or more inorganic insulating materials selected from the group consisting of aluminum oxide, titanium oxide, tantalum oxide, hafnium oxide, zinc oxide, silicon oxide, silicon nitride, and silicon oxynitride. In some embodiments, the first inorganic encapsulation layer 310 and the second inorganic encapsulation layer 330 may include an inorganic insulating layer including a non-metallic element, for example, such as silicon oxide, silicon nitride, or silicon oxynitride. The number and/or type of non-metallic elements included in the first inorganic encapsulation layer 310 may be different from the number and/or type of non-metallic elements included in the second inorganic encapsulation layer 330. For example, the first inorganic encapsulation layer 310 may include silicon oxynitride, and the second inorganic encapsulation layer 330 may include silicon nitride, but the present disclosure is not limited thereto.

The organic encapsulation layer 320 may relieve internal stress of the first inorganic encapsulation layer 310 and/or the second inorganic encapsulation layer 330. The organic encapsulation layer 320 may include a polymer-based material. Polymer-based materials may include, for example, polyethylene terephthalate, polyethylene naphthalate, polycarbonate, polyimide, polyethylene sulfonate, polyoxymethylene, polyarylate, hexamethyldisiloxane, acrylic resins (e.g., polymethyl methacrylate, polyacrylic acid, or the like), or any suitable combination thereof.

In some embodiments, the organic encapsulation layer 320 may be formed by applying a monomer layer having a flow property, and curing the monomer layer using heat or light, for example, such as ultraviolet light. In another embodiment, the organic encapsulation layer 320 may be formed by applying one or more of the above-described polymer-based materials.

The auxiliary layer 315 is interposed between the first inorganic encapsulation layer 310 and the organic encapsulation layer 320. The auxiliary layer 315 may directly contact the first inorganic encapsulation layer 310 and the organic encapsulation layer 320. For example, the bottom surface of the auxiliary layer 315 may directly contact the top surface of the first inorganic encapsulation layer 310, and the top surface of the auxiliary layer 315 may directly contact the bottom surface of the organic encapsulation layer 320.

The auxiliary layer 315 may be an inorganic insulating layer containing a non-metal element. In an embodiment, the non-metal element contained in the auxiliary layer 315 may be the same non-metal element as that of the first inorganic encapsulation layer 310, and the non-metal element may be, for example, silicon (Si), oxygen (O), and/or nitrogen (N).

The light emitted from the organic light emitting diode OLED disposed in each pixel passes through the thin film encapsulation layer 300 to the outside. At this time, due to the thin film interference phenomenon of the thin film encapsulation layer 300 discussed above, the user may observe an image that may be greenish as a whole when viewed in a direction (e.g., a z direction) perpendicular to and a direction oblique to the substrate 100. According to the display device of one or more example embodiments of the present disclosure, however, as described above, by adjusting the refractive index and the thickness of the optical layer 240, the phenomenon in which the user may observe the screen of the display device to be greenish at a large viewing angle (e.g., 60° or more) due to the generated interference may be prevented or substantially prevented.

Figure 5:
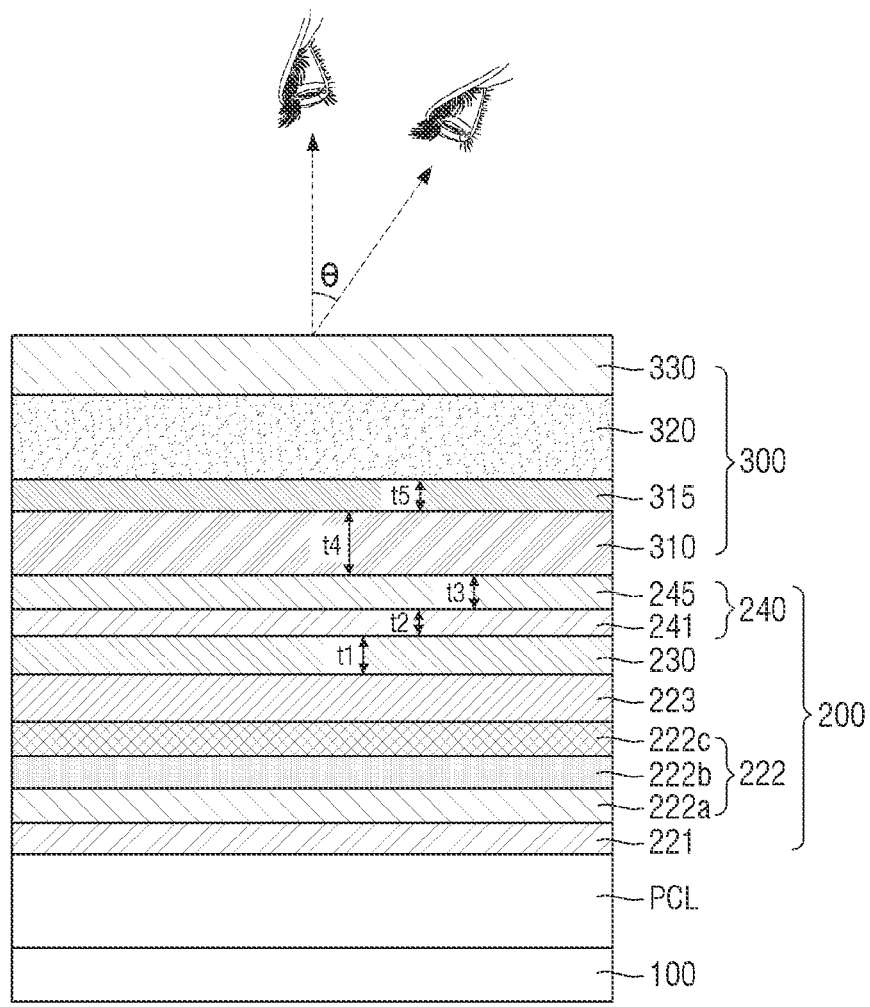
FIG. 5 is a schematic diagram schematically illustrating a display device according to an example embodiment.

FIG. 5 is a schematic diagram schematically illustrating a display device according to an example embodiment.

Referring to FIG. 5, the display device 10 includes the substrate 100, the pixel circuit layer PCL, a display layer 200, and the thin film encapsulation layer 300, which are sequentially stacked on one another. The display layer 200 may include the pixel electrode 221, the intermediate layer 222, the counter electrode 223, the capping layer 230, and the optical layer 240, which are sequentially stacked on one another.

The optical layer 240 may include the first optical layer 241 and the second optical layer 245 sequentially arranged along a light traveling direction (e.g., a direction from the display layer 200 toward the thin film encapsulation layer 300).

The thin film encapsulation layer 300 may include the first inorganic encapsulation layer 310 and the auxiliary layer 315 sequentially disposed along the light traveling direction (e.g., the direction from the display layer 200 toward the thin film encapsulation layer 300). The organic encapsulation layer 320 and the second inorganic encapsulation layer 330 may be disposed on the auxiliary layer 315.

The capping layer 230 may have a first thickness t1. The first thickness t1 may be in a range from about 30 nm to about 120 nm. The refractive index of the capping layer 230 may be in a range from about 1.6 to 2.3. For example, the first thickness t1 of the capping layer 230 may be about 64 nm, and the refractive index of the capping layer 230 may be about 1.97, but the present disclosure is not limited thereto.

The first optical layer 241 may have a second thickness t2. The second thickness t2 may be in a range from about 20 nm to about 60 nm. The refractive index of the first optical layer 241 may be in a range from about 1.62 to 1.89. For example, the second thickness t2 of the first optical layer 241 may be about 40 nm, and the refractive index of the first optical layer 241 may be about 1.77, but the present disclosure is not limited thereto.

The second optical layer 245 may have a third thickness t3. The third thickness t3 may be in a range from about 40 nm to about 100 nm. The refractive index of the second optical layer 245 may be in a range from about 1.45 to 1.62. For example, the third thickness t3 of the second optical layer 245 may be about 60 nm, and the refractive index of the second optical layer 245 may be about 1.52, but the present disclosure is not limited thereto.

Accordingly, in some embodiments, the refractive index of the first optical layer 241 may be between the refractive indices of the second optical layer 245 and the capping layer 230, for example, such that the refractive index of the first optical layer 241 may be greater than the refractive index of the second optical layer 245 and less than the refractive index of the capping layer 230. According to the present embodiment, by disposing the first optical layer 241, which may have a refractive index having a value between the refractive index of the second optical layer 245 and the refractive index of the capping layer 230, between the capping layer 230 and the second optical layer 245, the capping layer 230 and the first optical layer 241 having higher refractive indices compared to that of the second optical layer 245, it may be possible to prevent or substantially prevent the screen of the display device from being observed as being greenish at a large viewing angle (e.g., θ=60° or more) in the color coordinates of the display device 10.

Further, the capping layer 230 may have a thickness in the range of the first thickness t1, thereby improving a distribution of the thickness of the intermediate layer 222 of the organic light emitting diode OLED. In other words, by allowing the capping layer 230 to have the first thickness t1 of 30 nm or more, the thickness distribution of the intermediate layer 222 of the organic light emitting diode OLED described above may be improved, and by allowing the capping layer 230 to have the first thickness t1 of 120 nm or less, it may be possible to prevent or substantially prevent the capping layer 230 from being peeled off or separated.

By allowing the first optical layer 241 to have the second thickness t2 of 20 nm or more, it may be possible to prevent or substantially prevent the screen of the display device from being greenish at a large viewing angle (e.g., θ=60° or more) in the color coordinates of the display device 10, and by allowing the first optical layer 241 to have the second thickness t2 of 60 nm or less, it may be possible to prevent or substantially prevent the first optical layer 241 from being peeled off or separated. Similarly, by allowing the second optical layer 245 to have the third thickness t3 of 40 nm or more, it may be possible to prevent or substantially prevent the screen of the display device from being observed as being greenish at a large viewing angle (e.g., θ=60° or more) in the color coordinates of the display device 10, and by allowing the second optical layer 245 to have the third thickness t3 of 100 nm or less, it may be possible to prevent or substantially prevent the second optical layer 245 from being peeled off or separated.

The first inorganic encapsulation layer 310 may be disposed on the second optical layer 245.

The first inorganic encapsulation layer 310 may have a fourth thickness t4 in a range from about 600 nm to 2200 nm. When the fourth thickness t4 of the first inorganic encapsulation layer 310 is 600 nm or more, moisture permeation may be prevented or substantially prevented, and when the fourth thickness t4 of the first inorganic encapsulation layer 310 is 2200 nm or less, it may be possible to prevent or substantially prevent the first inorganic encapsulation layer 310 from being peeled off or separated. The thickness of the second inorganic encapsulation layer 330 may be the same or substantially the same as that of the first inorganic encapsulation layer 310, or may be different (e.g., may be smaller or larger) than that of the first inorganic encapsulation layer 310.

On the other hand, light emitted from the display element passes through the thin film encapsulation layer 300 such that interference of light or the like may occur, and although the interference of light may be controlled (e.g., may be designed) by using the above-described optical layer 240 to prevent or substantially prevent the screen of the display device from appearing greenish at a large viewing angle (e.g., θ=60° or more) in the color coordinates of the display device 10, a large variation in the color coordinates may occur. In order to reduce the large variation in the color coordinates, a method of adjusting the thickness of the first inorganic encapsulation layer 310 may be considered, but controlling the thickness may not be practically easy due to the error of an equipment itself (e.g., a CVD equipment) used for forming the first inorganic encapsulation layer 310. For example, the first inorganic encapsulation layer 310, which protects or substantially protects the display layer 200 from moisture and/or the like, may have a thickness in a range of about 600 nm to 2200 nm as described above, to prevent or substantially prevent separation of the first inorganic encapsulation layer 310 or the like. For example, when the error of the equipment used for forming the first inorganic insulating encapsulation layer 310 is about 10%, a deviation in the thickness of the first inorganic encapsulation layer 310 that is actually formed may correspond to a range of tens to hundreds of nanometers. Thus, it may be practically difficult to control the thickness of the first inorganic encapsulation layer 310 to reduce a variation in the minimal perceptible color difference (MPCD), and there may be a limitation in reducing the variation in the MPCD.

Accordingly, the thin film encapsulation layer 300 according to an example embodiment may include the auxiliary layer 315 on the first inorganic encapsulation layer 310, thereby reducing a variation in the MPCD described above, regardless of the thickness of the first inorganic encapsulation layer 310.

The auxiliary layer 315 may be formed of an inorganic insulating material, and may have a fifth thickness t5 suitable for reducing (e.g., minimizing) or preventing a variation in the MPCD described above. For example, the fifth thickness t5 may be 100 nm or less. In some embodiments, for example, the fifth thickness t5 of the auxiliary layer 315 may be in a range of about 30 nm to 100 nm. When the fifth thickness t5 of the auxiliary layer 315 is 100 nm or less, control of the fifth thickness t5 of the auxiliary layer 315 may be performed (e.g., may be easily performed).

The auxiliary layer 315 may include an inorganic insulating material. As described above, an inorganic insulating material layer formed by using the CVD equipment may have an error of about 10% corresponding to the thickness that may be actually formed when compared to a target thickness. Because the auxiliary layer 315 may be formed using the CVD equipment in a similar manner (e.g., in the same or substantially the same way) as that of the first inorganic encapsulation layer 310, the thickness of the auxiliary layer 315 that is actually formed may be different from the target thickness. However, because the thickness of the auxiliary layer 315 may be more than tens of times smaller than the thickness of the first inorganic encapsulation layer 310, it may be easier (e.g., in may be much easier) to control the thickness of the auxiliary layer 315 regardless of the error (e.g., an error of about 10%) of the thickness according to the CVD equipment used.

The first inorganic encapsulation layer 310 and the auxiliary layer 315 may have different refractive indices from each other. For example, the refractive index n3 of the auxiliary layer 315 may satisfy the following condition:

$$\min(n1,n2)+|n2-n1|\times 0.25 < n3 < \min(n1,n2)+|n2-n1|\times 0.75$$

Here, n1 represents the refractive index of the first inorganic encapsulation layer, n2 represents the refractive index of the organic encapsulation layer, min(n1, n2) represents the minimum value of n1 and n2, and |n2−n1| represents the absolute value of the difference between n2 and n1.

When the refractive index n3 of the auxiliary layer 315 is within the above-described range, it may be possible to reduce (e.g., to minimize) or to prevent the occurrence of a large variation of the MPCD.

Figure 6:
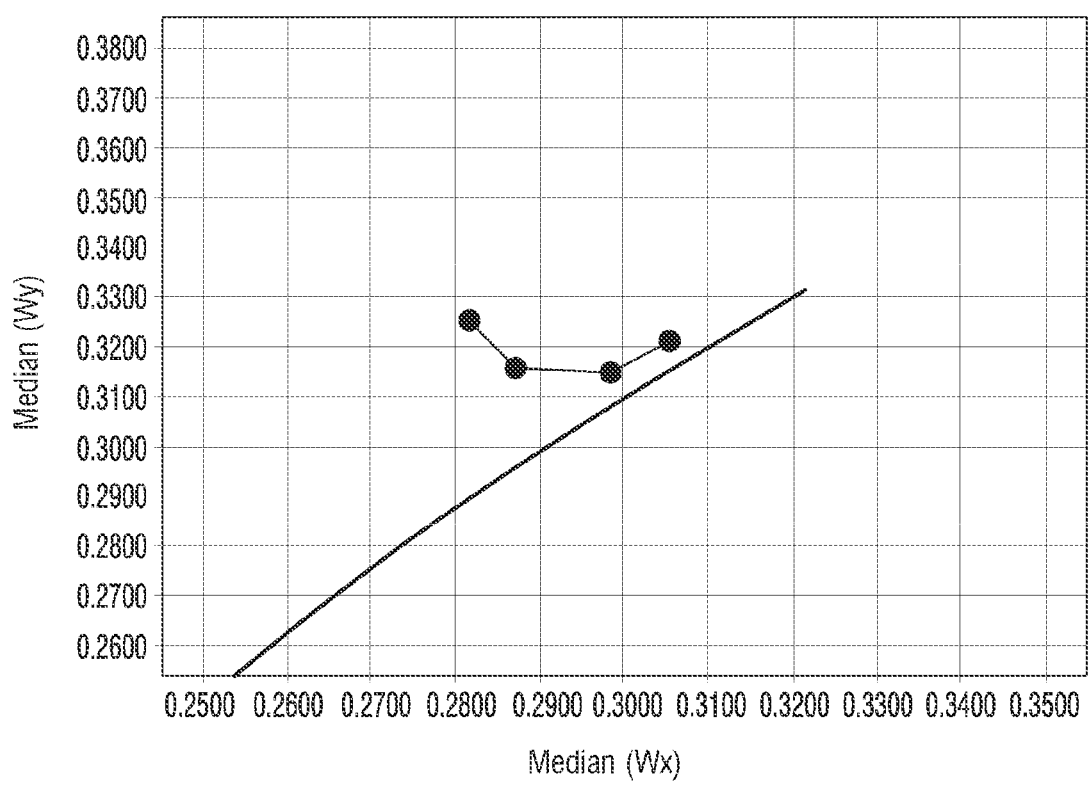
FIG. 6 is a graph illustrating a minimum perceptible color difference (MPCD) when an optical layer according to an example embodiment is omitted.
Figure 7:
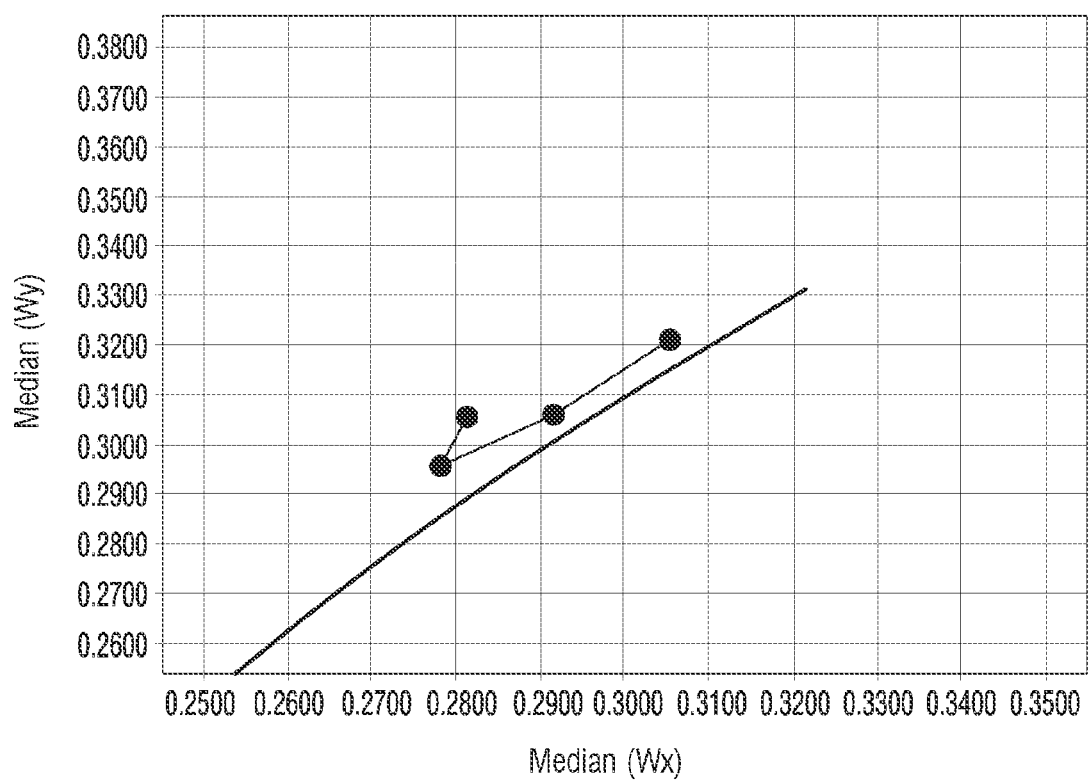
FIG. 7 is a graph illustrating a minimum perceptible color difference (MPCD) when an optical layer according to an example embodiment is applied.

FIG. 6 is a graph illustrating a minimum perceptible color difference (MPCD) when the optical layer according to an example embodiment is omitted. FIG. 7 is a graph illustrating a minimum perceptible color difference (MPCD) when the optical layer according to an example embodiment is applied. FIG. 6 shows the MPCD when the above-described optical layer 240 is omitted, and FIG. 7 shows the MPCD when the above-described optical layer 240 is included (e.g., is disposed).

Referring to FIGS. 6 and 7, the MPCD is illustrated as a contour line by dividing a section (e.g., a predetermined section), and the MPCD illustrates that having a negative (−) value in a direction away from 0 (zero) with respect to the vertical axis indicates a color appearing greenish, and having a positive (+) value in a direction away from 0 (zero) with respect to the vertical axis indicates a color appearing bluish.

The contour line of the MPCD is illustrated based on the MPCD value when the display device 10 is viewed in a direction perpendicular to and a direction oblique to the substrate 100, for example, at 0° (e.g., in the z direction) and at an oblique angle of about 30°, 45°, and 60° with respect to the z direction, as illustrated in FIG. 5.

According to the example of FIG. 6, it is shown that the screen of the display device may appear greenish at a large viewing angle (e.g., θ=60° or more) in the MPCD of the corresponding display device. On the other hand, according to the embodiment of FIG. 7, by disposing the first optical layer 241, which may have a refractive index having a value between the refractive index of the second optical layer 245 and the refractive index of the capping layer 230, between the capping layer 230 and the second optical layer 245, the capping layer 230 and the first optical layer 241 having higher refractive indices compared to that of the second optical layer 245, it may be possible to reduce (e.g., to minimize) or to prevent a phenomenon in that the screen of the display device appears greenish at a large viewing angle (e.g., θ=60° or more) in the MPCD of the display device 10.

Figure 8:
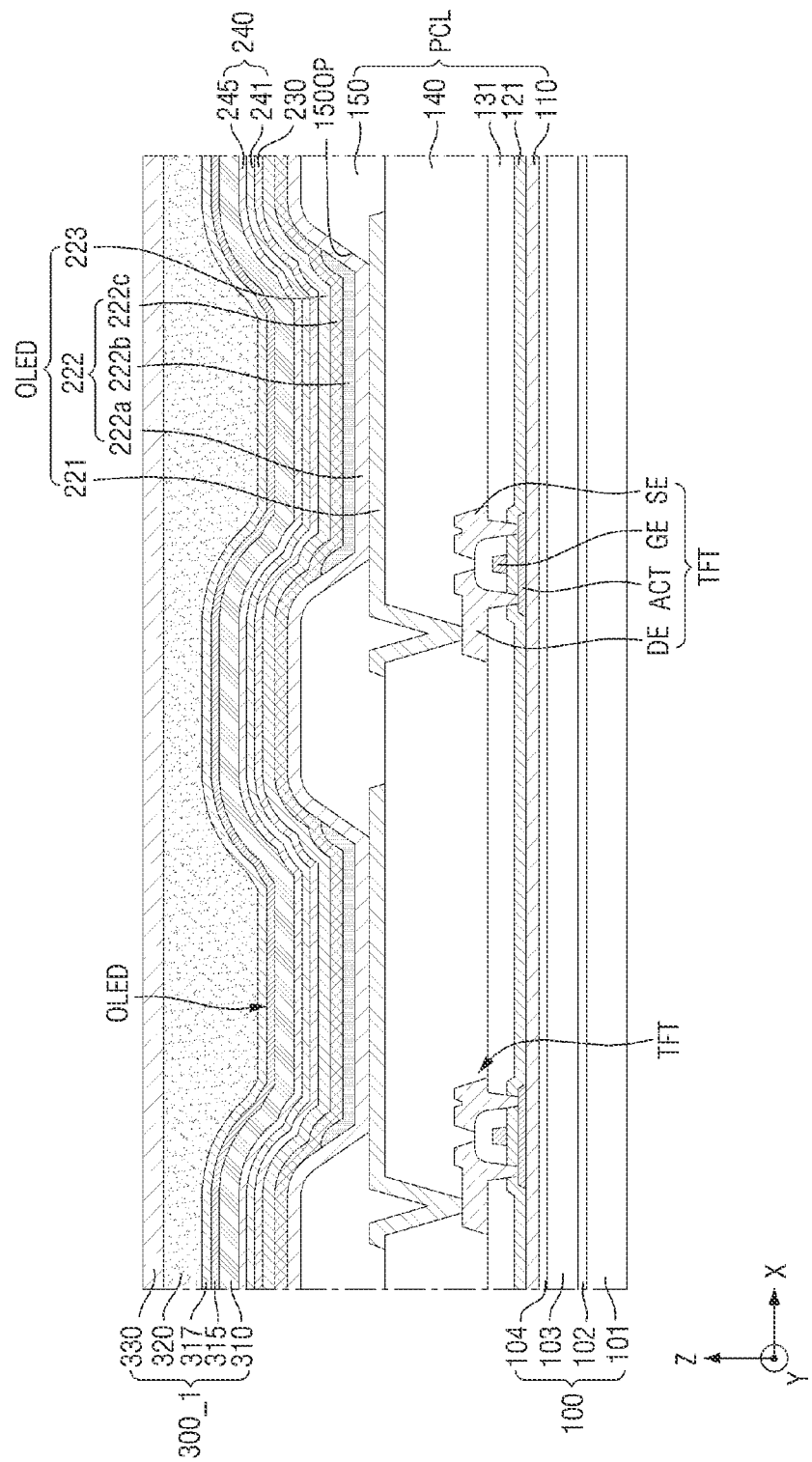
FIG. 8 is a cross-sectional view illustrating a portion of a display device according to another embodiment.
Figure 9:
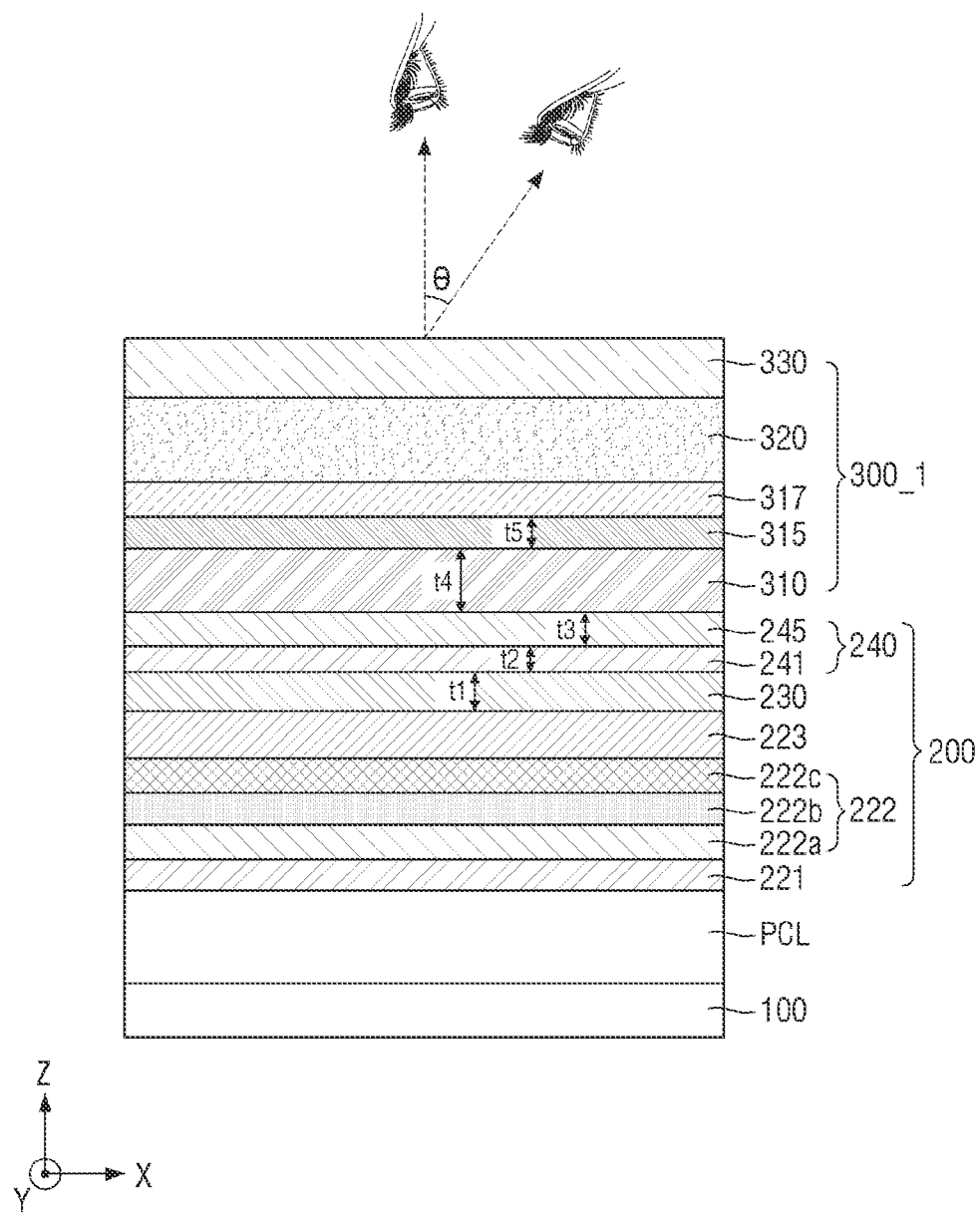
FIG. 9 is a schematic diagram schematically illustrating a display device according to another embodiment.

Hereinafter, a display device according to another embodiment will be described with reference to FIGS. 8 and 9. In the embodiment of FIGS. 8 and 9, the same or substantially the same components as those of one or more of the above-described embodiments are denoted by the same reference numerals, and thus, redundant description thereof may be simplified or may not be repeated.

FIG. 8 is a cross-sectional view illustrating a portion of a display device according to another embodiment. FIG. 9 is a schematic diagram schematically illustrating a display device according to another embodiment.

Referring to FIGS. 8 and 9, the display device may include the substrate 100, the pixel circuit layer PCL, the display layer 200, and a thin film encapsulation layer 300_1, which are sequentially stacked on one another. The thin film encapsulation layer 300_1 may be similar to the thin film encapsulation layer 300 described above, except the thin film encapsulation layer 300_1 may further include a lower layer 317 disposed under the organic encapsulation layer 320. Except for the lower layer 317, the other elements shown in FIGS. 8 and 9 are the same or substantially the same as those of the embodiment described with reference to FIGS. 3 and 5, such that the following description may be focused on the lower layer 317.

The lower layer 317 may be interposed between the organic encapsulation layer 320 and the auxiliary layer 315.

The lower layer 317 may not have a role as a thin film encapsulation layer, for example, such as reducing moisture permeability. The lower layer 317 may control a material for forming the organic encapsulation layer 320 during the process for forming the organic encapsulation layer 320, for example, when applying and curing the monomer.

The lower layer 317 may be a layer having no separate optical function as well as having no moisture permeability reducing function as described above, and the refractive index of the lower layer 317 may be the same or substantially the same as the refractive index of the organic encapsulation layer 320. The refractive index of the lower layer 317 and the refractive index of the organic encapsulation layer 320 may be the same or substantially the same as each other when a difference Δn between the refractive index of the lower layer 317 and the refractive index of the organic encapsulation layer 320 is less than 0.05. For example, in an embodiment, the refractive index of the lower layer 317 may be 1.52.

The thickness of the lower layer 317 may be selected in the range of about 50 nm to 100 nm, for example, such as about 55 nm to 90 nm, or 60 nm to 85 nm. Although the refractive index of the lower layer 317 and the refractive index of the organic encapsulation layer 320 may be the same or substantially the same as each other, an interface may exist between the lower layer 317 and the organic encapsulation layer 320, which may be in contact with each other, because the lower layer 317 and the organic encapsulation layer 320 may include different materials from each other.

The lower layer 317 may include an inorganic insulating layer. For example, the lower layer 317 may contain a non-metallic element like the first inorganic encapsulation layer 310 and the auxiliary layer 315, or may contain an element and/or material different from the non-metallic element included in the first inorganic encapsulation layer 310 and the auxiliary layer 315. For example, the lower layer 317 may be an inorganic insulating layer having a relatively high oxygen content, for example, such as an O-rich silicon oxynitride layer.

For example, the first inorganic encapsulation layer 310, the auxiliary layer 315, and the lower layer 317 may each include the same non-metal element as each other, such as silicon (Si), oxygen (O), and/or nitrogen (N). A first silicon oxynitride layer as the first inorganic encapsulation layer 310, a second silicon oxynitride layer as the auxiliary layer 315, and a third silicon oxynitride layer as the lower layer 317 may have different content ratios of silicon (Si), oxygen (O), and nitrogen (N), respectively. Accordingly, an interface may exist between the first silicon oxynitride layer and the second silicon oxynitride layer, and an interface may exist between the second silicon oxynitride layer and the third silicon oxynitride layer.

For example, the refractive index n3 of the auxiliary layer 315 may satisfy the following condition:

$$\min(n1,n2)+|n2-n1|\times 0.25 < n3 < \min(n1,n2)+|n2-n1|\times 0.75$$

Here, n1 represents the refractive index of the first inorganic encapsulation layer, n2 represents the refractive index of the organic encapsulation layer, min(n1, n2) represents the minimum value of n1 and n2, and |n2−n1| represents the absolute value of the difference between n2 and n1.

In the present embodiment, by disposing a first optical layer 241, which may have a refractive index having a value between the refractive index of a second optical layer 245 and the refractive index of the capping layer 230, between the capping layer 230 and the second optical layer 245, the capping layer 230 and the first optical layer 241 having higher refractive indices compared to that of the second optical layer 245, it may be possible to reduce (e.g., to minimize) or to prevent a phenomenon in that the screen of the display device appears greenish at a large viewing angle (e.g., θ=60° or more) in the MPCD of the display device 10.

Figure 10:
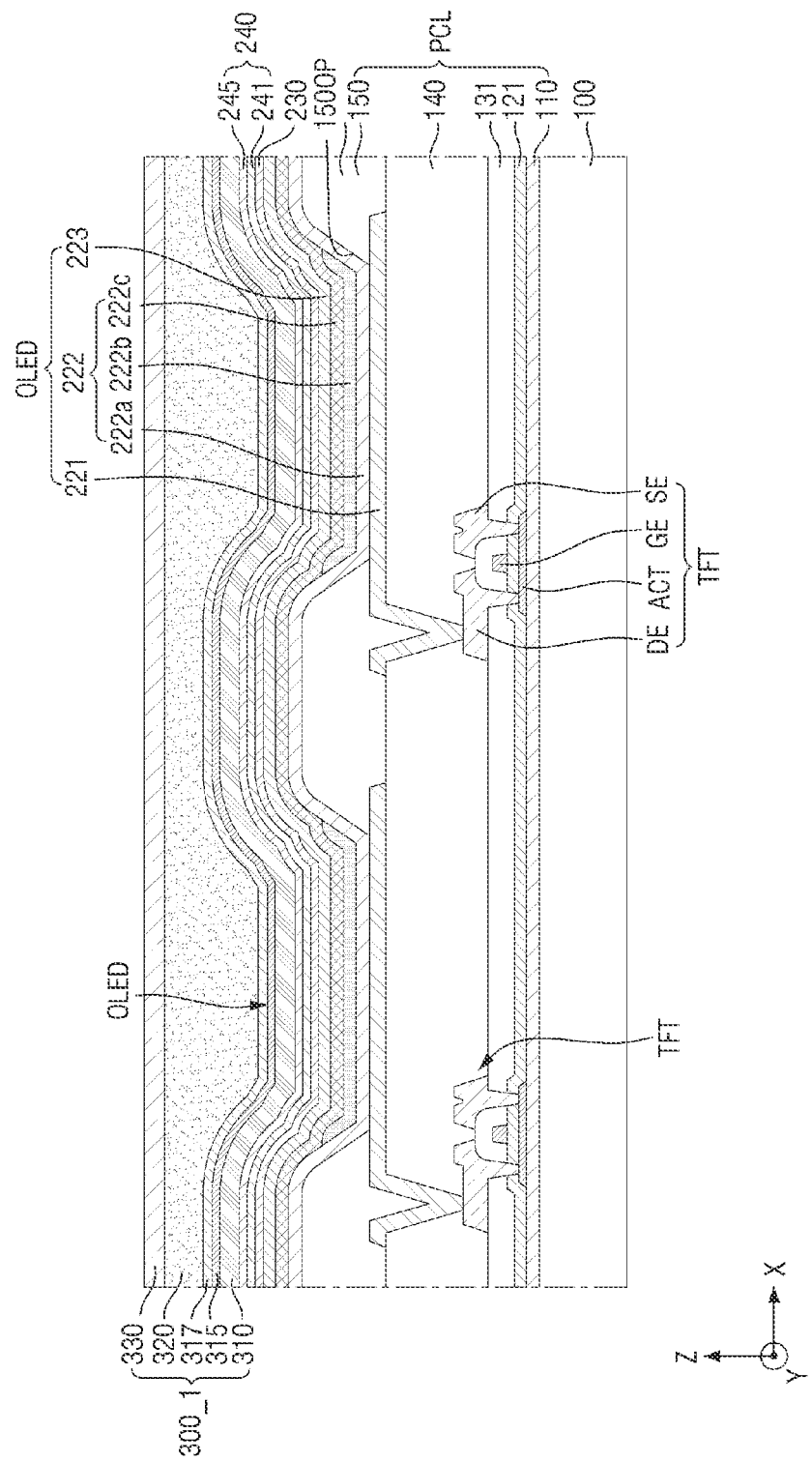
FIG. 10 is a cross-sectional view illustrating a portion of a display device according to a modified example of the display device of FIG. 8.

FIG. 10 is a cross-sectional view illustrating a portion of a display device according to a modified example of the display device of FIG. 8.

Referring to FIG. 10, as a modified example of the display device of FIG. 8, the substrate 100 may have a single layer structure including a glass material. For example, the substrate 100 may be a glass substrate including SiO2 as a main component.

In the present embodiment, by disposing a first optical layer 241, which may have a refractive index having a value between the refractive index of a second optical layer 245 and the refractive index of the capping layer 230, between the capping layer 230 and the second optical layer 245, the capping layer 230 and the first optical layer 241 having higher refractive indices compared to that of the second optical layer 245, it may be possible to reduce (e.g., to minimize) or to prevent a phenomenon in that the screen of the display device appears greenish at a large viewing angle (e.g., θ=60° or more) in the MPCD of the display device 10.

Figure 11:
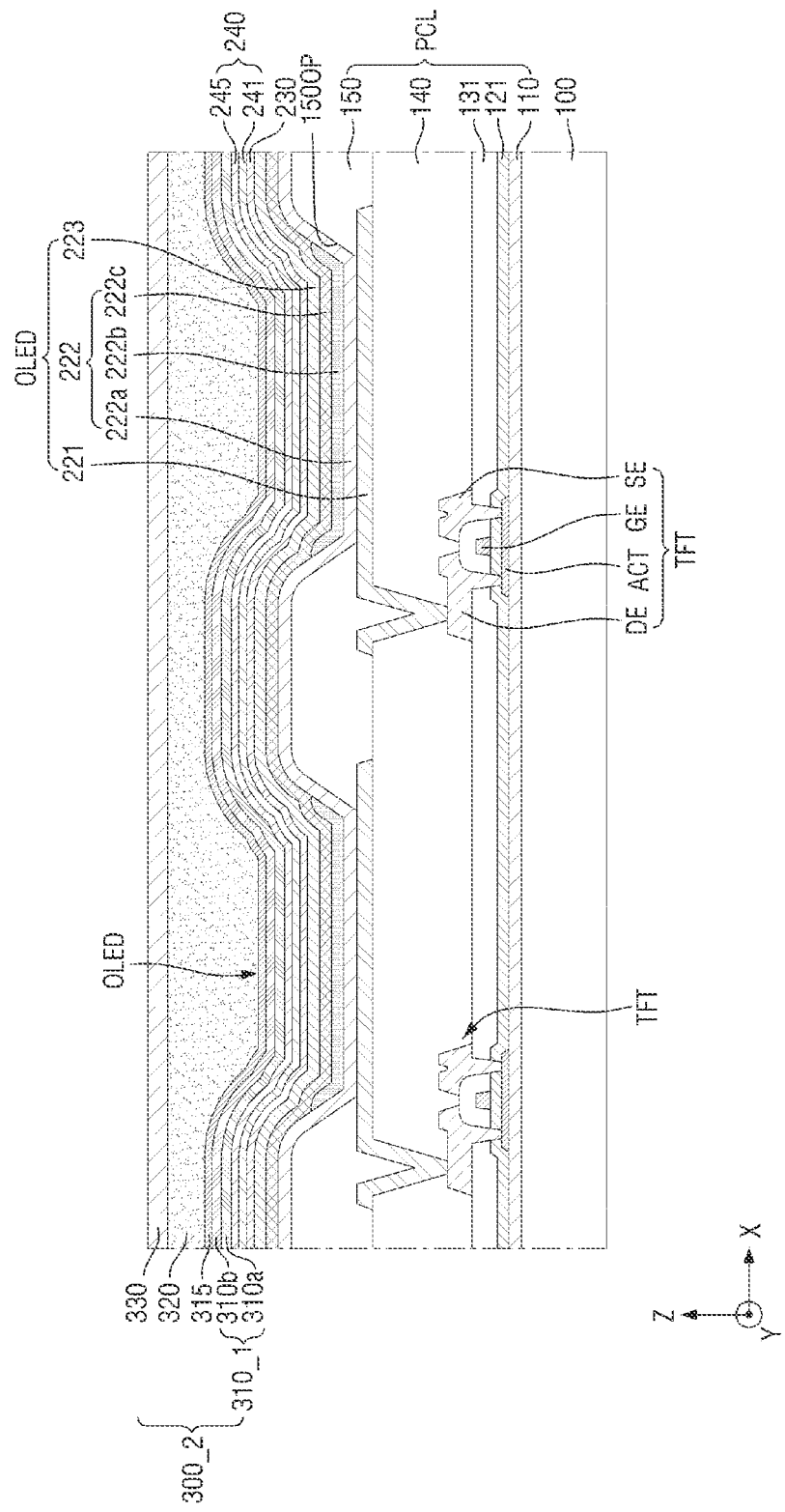
FIG. 11 is a cross-sectional view illustrating a portion of a display device according to still another embodiment.
Figure 12:
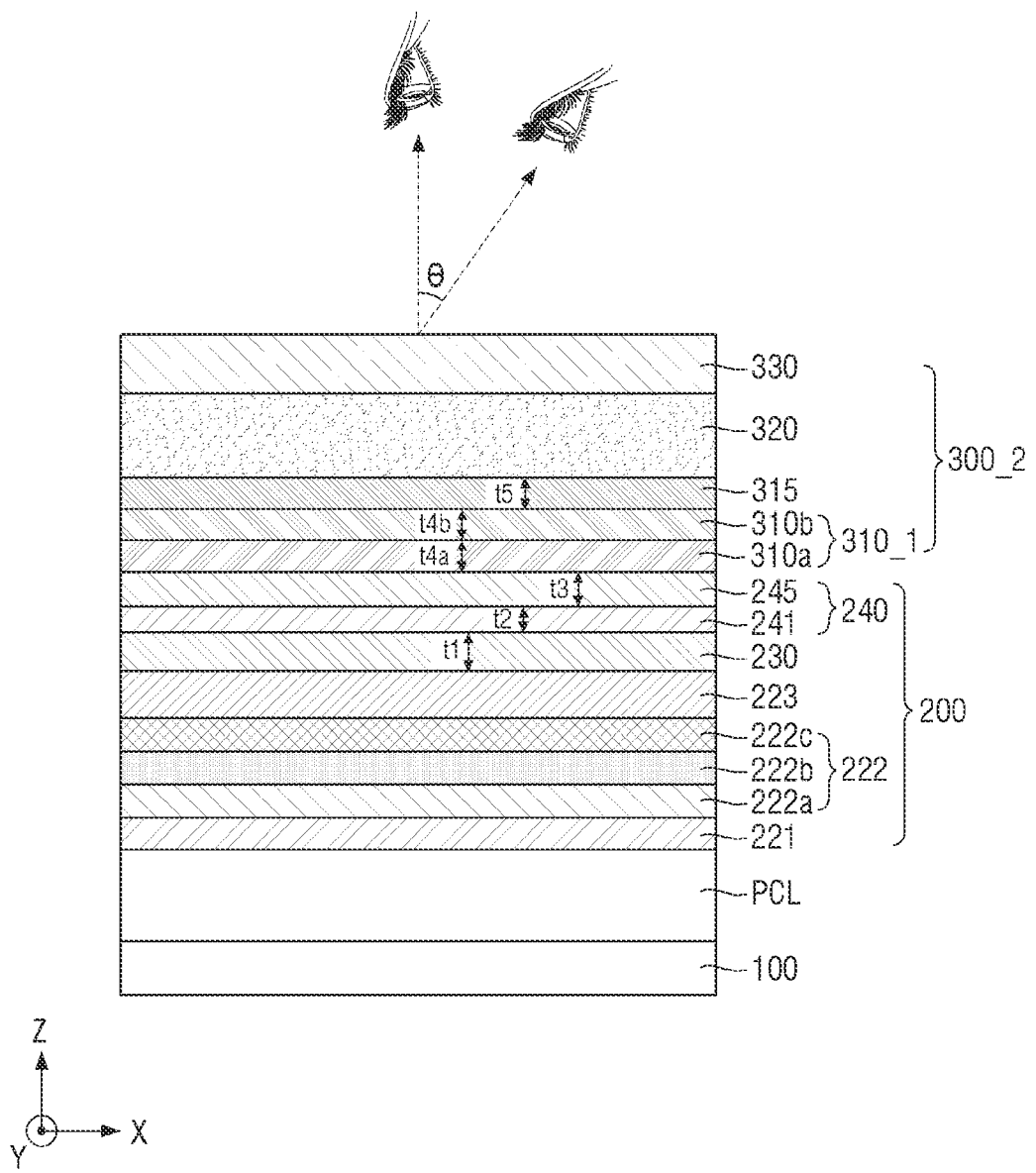
FIG. 12 schematically illustrates a display device according to still another embodiment.

FIG. 11 is a cross-sectional view illustrating a portion of a display device according to still another embodiment. FIG. 12 schematically illustrates a display device according to still another embodiment.

Referring to FIGS. 11 and 12, the display device according to the present embodiment may be different from the display device of FIGS. 4 and 5 in that a thin film encapsulation layer 300_2 may include a first inorganic encapsulation layer 310_1 having a multilayered structure, which may be different from the first inorganic encapsulation layer 310 of FIGS. 4 and 5. Except for the first inorganic encapsulation layer 310_1, the other elements shown in FIGS. 11 and 12 may be the same or substantially the same as those of the embodiments described with reference to FIGS. 4 and 5, such that the following description may be focused on the first inorganic encapsulation layer 310_1.

In more detail, in the display device 10 according to the present embodiment, the thin film encapsulation layer 300_2 may include the first inorganic encapsulation layer 310_1.

The first inorganic encapsulation layer 310_1 may include a plurality of stacked layers. For example, the first inorganic encapsulation layer 310_1 may include a first sub inorganic encapsulation layer 310a interposed between the second optical layer 245 and a second sub inorganic encapsulation layer 310b, and the second sub inorganic encapsulation layer 310b interposed between the first sub inorganic encapsulation layer 310a and the auxiliary layer 315. Although it is illustrated in FIGS. 11 and 12 that the first inorganic encapsulation layer 310_1 includes two stacked films that are sequentially stacked, the present disclosure is not limited thereto, and the first inorganic encapsulation layer 310_1 may include three or more stacked films that are sequentially stacked.

A sum of the thicknesses of the first sub inorganic encapsulation layer 310a and the second sub inorganic encapsulation layer 310b may have a range that is the same or substantially the same as that of the fourth thickness t4 (e.g., from about 600 nm to 2200 nm) of the first inorganic encapsulation layer 310 described with reference to FIGS. 4 and 5. The thickness of the first sub inorganic encapsulation layer 310a may be different from or the same as the thickness of the second sub inorganic encapsulation layer 310b.

The refractive indices of each of the first sub inorganic encapsulation layer 310a and the second sub inorganic encapsulation layer 310b may be selected to be within the refractive index range of the first inorganic encapsulation layer 310 described above with reference to FIG. 5. For example, the refractive indices of the first sub inorganic encapsulation layer 310a and the second sub inorganic encapsulation layer 310b may be the same or substantially the same as each other.

In the present embodiment, by disposing a first optical layer 241, which may have a refractive index having a value between the refractive index of a second optical layer 245 and the refractive index of the capping layer 230, between the capping layer 230 and the second optical layer 245, the capping layer 230 and the first optical layer 241 having higher refractive indices compared to that of the second optical layer 245, it may be possible to reduce (e.g., to minimize) or to prevent a phenomenon in that the screen of the display device appears greenish at a large viewing angle (e.g., θ=60° or more) in the MPCD of the display device 10.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
   a substrate;
   a display element on the substrate;
   a capping layer on the display element;
   a first inorganic layer on the capping layer;
   a second inorganic layer on the first inorganic layer;
   a third inorganic layer on the second inorganic layer;
   a fourth inorganic layer on the third inorganic layer;
   an organic layer on the fourth inorganic layer; and
   a fifth inorganic layer on the organic layer,
   wherein a refractive index of the second inorganic layer is different from a refractive index of the capping layer, and
   wherein a refractive index of the first inorganic layer is between the refractive index of the second inorganic layer and the refractive index of the capping layer.

2. The display device of claim 1, wherein the refractive index of the first inorganic layer is in a range from 1.62 to 1.89, and a thickness of the first inorganic layer is in a range from 20 nm to 60 nm.

3. The display device of claim 2, wherein the refractive index of the second inorganic layer is in a range from 1.45 to 1.62, and a thickness of the second inorganic layer is in a range from 40 nm to 100 nm.

4. The display device of claim 1, wherein the refractive index of the capping layer is in a range from 1.6 to 2.3, and a thickness of the capping layer is in a range from 30 nm to 120 nm.

5. The display device of claim 1, wherein a thickness of the fourth inorganic layer is in a range from 30 nm to 100 nm, and a thickness of the third inorganic layer is in a range from 400 nm to 2200 nm.

6. The display device of claim 5, wherein:
   the fourth inorganic layer is interposed between the third inorganic layer and the organic layer;
   a refractive index of the third inorganic layer is greater than a refractive index of the fourth inorganic layer; and the refractive index of the fourth inorganic layer is between the refractive index of the third inorganic layer and a refractive index of the organic layer.

7. The display device of claim 6, wherein the refractive index of the fourth inorganic layer satisfies:

$$\min(n1,n2)+|n2-n1|\times 0.25 < n3 < \min(n1,n2)+|n2-n1|\times 0.75,$$

where n3 represents the refractive index of the fourth inorganic layer, n1 represents the refractive index of the third inorganic layer, n2 represents the refractive index of the organic layer, min(n1, n2) represents a minimum value of n1 or n2, and |n2−n1| represents an absolute value of a difference between n2 and n1.

8. The display device of claim 1, wherein the display element comprises light emitting diodes.

9. The display device of claim 1, further comprising:
a lower layer interposed between the fourth inorganic layer and the organic layer,
wherein the lower layer comprises an inorganic insulating material.

10. The display device of claim 9, wherein the lower layer directly contacts the organic layer.

11. The display device of claim 9, wherein:
a refractive index of the fourth inorganic layer is greater than a refractive index of the organic layer, and
a refractive index of the lower layer is between the refractive index of the fourth inorganic layer and the refractive index of the organic layer.

12. The display device of claim 11, wherein the refractive index of the fourth inorganic layer satisfies:

$$\min(n1,n2)+|n2-n1|\times 0.25 < n3 < \min(n1,n2)+|n2-n1|\times 0.75,$$

where n3 represents the refractive index of the fourth inorganic layer, n1 represents a refractive index of the third inorganic layer, n2 represents the refractive index of the lower layer, min(n1, n2) represents a minimum value of n1 or n2, and |n2−n1| represents an absolute value of a difference between n2 and n1.

13. The display device of claim 11, wherein:
a difference between the refractive index of the lower layer and the refractive index of the organic layer is less than 0.05.

14. The display device of claim 13, wherein:
the lower layer and the fourth inorganic layer comprise an inorganic insulating material comprising a silicon element, a nitrogen element, and an oxygen element; and
an oxygen content of the lower layer is greater than an oxygen content of the fourth inorganic layer.

15. The display device of claim 1, wherein the third inorganic layer comprises a plurality of stacked films.

16. The display device of claim 1, wherein the refractive index of the second inorganic layer is smaller than the refractive index of the capping layer.

* * * * *